(12) United States Patent
Huang

(10) Patent No.: US 7,158,384 B2
(45) Date of Patent: Jan. 2, 2007

(54) VIBRATION REDUCING STRUCTURE OF ELECTRONIC DEVICE

(75) Inventor: Jui Ching Huang, Samutprakarn (TH)

(73) Assignees: Delta Electronics, Inc. (TW); Delta Electronics (Thailand) Public Company, Limited (TH)

( * ) Notice: Subject to any disclaimer, the term of this patent is extended or adjusted under 35 U.S.C. 154(b) by 0 days.

(21) Appl. No.: 11/125,039

(22) Filed: May 9, 2005

(65) Prior Publication Data
US 2006/0250779 A1 Nov. 9, 2006

(51) Int. Cl.
*H05K 5/00* (2006.01)
(52) U.S. Cl. .............. 361/752; 361/742; 361/758; 361/730; 361/736; 174/544; 174/520; 174/535
(58) Field of Classification Search .............. 361/752, 361/728–730, 736, 742, 758, 770, 796, 804; 174/50, 544, 520, 525, 535
See application file for complete search history.

(56) References Cited

U.S. PATENT DOCUMENTS

| 5,812,375 | A | * | 9/1998 | Casperson | 361/707 |
| 6,122,815 | A | * | 9/2000 | Kownacki et al. | 29/426.1 |
| 6,128,195 | A | * | 10/2000 | Weber et al. | 361/752 |
| 6,242,690 | B1 | * | 6/2001 | Glover | 174/387 |
| 6,407,925 | B1 | * | 6/2002 | Kobayashi et al. | 361/752 |
| 6,594,151 | B1 | * | 7/2003 | Dixon et al. | 361/753 |
| 6,816,381 | B1 | * | 11/2004 | Takeuchi | 361/752 |
| 7,023,699 | B1 | * | 4/2006 | Glovatsky et al. | 361/704 |

* cited by examiner

*Primary Examiner*—Tuan Dinh
*Assistant Examiner*—Dameon E. Levi

(57) ABSTRACT

A vibration reducing structure of an electronic device includes first and second housings, a printed circuit board, a first post and a second post. The first and second housings define a closed space therebetween. The printed circuit board is disposed within the space and having a heavy component mounted on a first surface thereof. The first post is arranged on the first housing and under the heavy component. The second post is arranged on the second housing and above the heavy component.

13 Claims, 3 Drawing Sheets

VIBRATION REDUCING STRUCTURE OF ELECTRONIC DEVICE

FIELD OF THE INVENTION

The present invention relates to a vibration reducing structure of an electronic device, and more particularly to a vibration reducing structure of an electronic device for minimizing the vibration impact on the printed circuit board of the electronic device.

BACKGROUND OF THE INVENTION

Power adapters, chargers or power supply device are indispensable electronic devices for many kinds of electrical apparatuses and information apparatuses. Referring to FIG. 1(a), a schematic cross-sectional view of a conventional power adapter is shown. This power adapter 1 includes an upper housing 11 and a lower housing 12. A space is defined between the upper housing 11 and the lower housing 12 for accommodating a printed circuit board 13 therein. An AC inlet 14 and a DC power cord connector 15 are mounted on opposite sides of the printed circuit board 13. Several protrusion pieces 120 are integrally formed on opposite sides of the inner surface of the lower housing 12 for supporting the periphery of the printed circuit board 13. Many electronic components required for implementing functions of the power adapter are also mounted on the printed circuit board 13. Generally, depending on the weights, these electronic components are classified into two types: heavier components and lighter components. For neat drawings, however, only two electronic components 16 and 17 indicating heavier and lighter components, respectively, are shown in the drawing. Examples of these electronic components include but are not limited to transformers, metal-oxide-semiconductor field effect transistors (MOS-FETs), bare dice, diodes, inductors, chokes, wound toroids, capacitors or resistors. As known, among these electronic components, transformers, inductors, chokes, wound toroids are relatively heavier than others.

As shown in FIG. 1(a), since the periphery of the printed circuit board 13 is supported on the protrusion pieces 120, a gap g1 is formed between the printed circuit board 13 and the inner surface of the lower housing 12. The gap g1 is advantageous to prevent direct contact of the soldering portions (not shown) of the components mount on bottom surface of the printed circuit board 13 with the lower housing 12 so as to assure good soldering properties. Otherwise, existence of the gap g1 still has some drawbacks. For example, in a case that the power adapter 1 accidentally falls down, the printed circuit board 13 may vibrate up and down in response to the sudden impact. Please refer to FIG. 1(b). An amplitude distribution analysis shows a two-node vibration spectrum. The largest vibration amplitude predominates at the region under the heavier component 16. In contrast, the region under the lighter component 17 exhibits less vibration amplitude. The nodes are substantially corresponding to the protrusion pieces 120. Accordingly, it is necessary to reduce the vibration amplitude at the region under the heavier component 16. If the vibration amplitude exceeds an allowable level, a fatigue crack of the printed circuit board 13 occurs.

Consequently, because of the technical defects of described above, the applicant keeps on carving unflaggingly through wholehearted experience and research to develop the present invention, which can effectively overcome the problems described above.

SUMMARY OF THE INVENTION

An object of the present invention is to provide a vibration reducing structure of an electronic device for minimizing the vibration impact on the printed circuit board of the electronic device.

In accordance with an aspect of the present invention, there is provided a vibration reducing structure of an electronic device. The vibration reducing structure comprises first and second housings, a printed circuit board, a first post and a second post. The first and second housings define a closed space therebetween. The printed circuit board is disposed within the space and having a heavy component mounted on a first surface thereof. The first post is arranged on the first housing and under the heavy component. The second post is arranged on the second housing and above the heavy component.

In an embodiment, the first post is integrally formed with the first housing.

In an embodiment, a gap is formed between the printed circuit board and the first post.

In an embodiment, the printed circuit board further comprises an opening corresponding to the first post.

In an embodiment, the first post penetrates through the opening and a gap is formed between the bottom of the heavy component and the first post.

In an embodiment, the second post is integrally formed with the second housing.

In an embodiment, the second post is corresponding to the first post.

In an embodiment, the heavy component is an electronic component selected from a group consisting of a transformer, an inductor, a choke and a wound toroid.

In an embodiment, the first and second housings are lower and upper housing of the electronic device, respectively.

In an embodiment, the electronic device further comprises a plurality of protrusion pieces integrally formed on opposite sides of the inner surface of the lower housing for supporting the periphery of the printed circuit board.

In an embodiment, the electronic device is selected from a group consisting of a power adapter, a charger and a power supply device.

In an embodiment, the electronic device further comprises a plurality of ribs arranged on the first housing.

In an embodiment, the ribs are integrally formed with the first housing.

In an embodiment, the ribs comprise at least one first rib extended in a first direction and at least one second rib extended in a second direction.

In an embodiment, the first direction is perpendicular to the second direction.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

For purposes of clarity, like elements are designated by identical numeral references in this description.

Figure 1A:
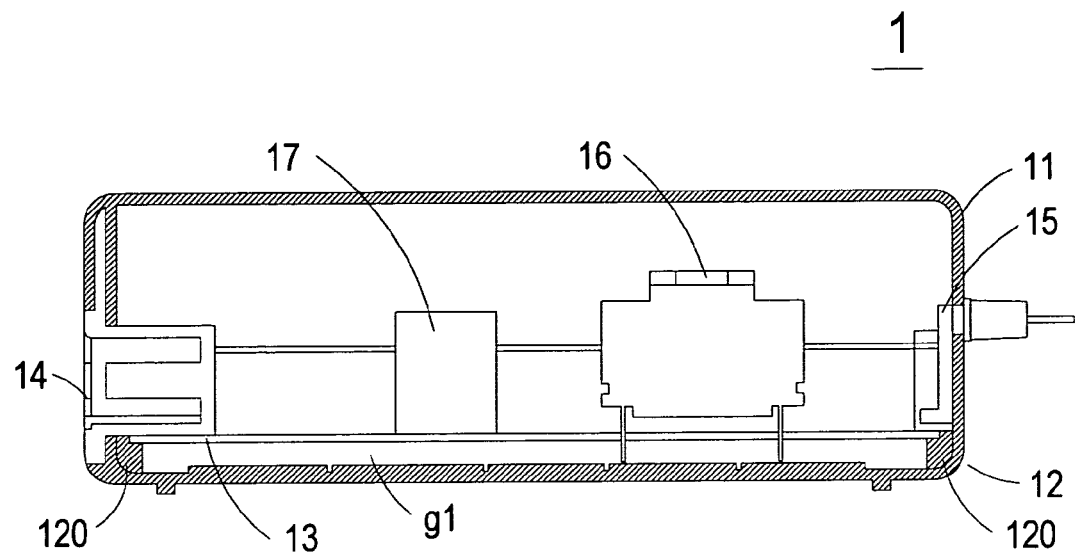
FIG. 1(a) is a schematic side view of a conventional power adapter.
Figure 1B:
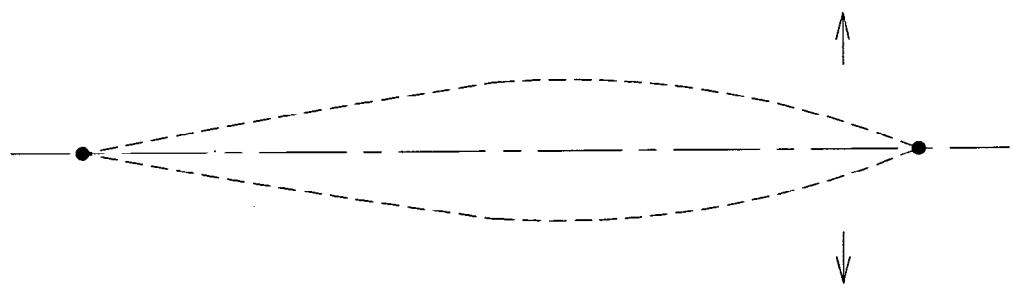
FIG. 1(b) is a schematic amplitude distribution diagram of the printed circuit board of the power adapter in FIG. 1(a)
Figure 2A:
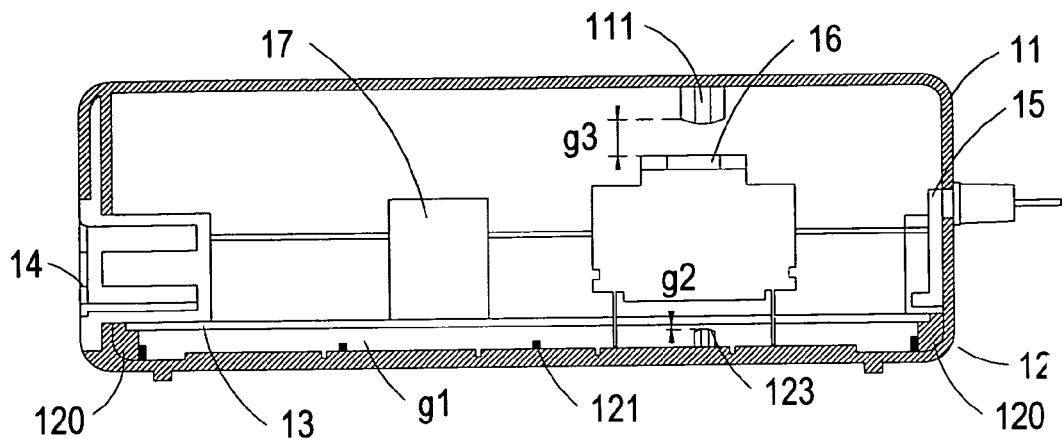
FIG. 2(a) is a schematic side view of a power adapter according to a preferred embodiment of the present invention.
Figure 2B:
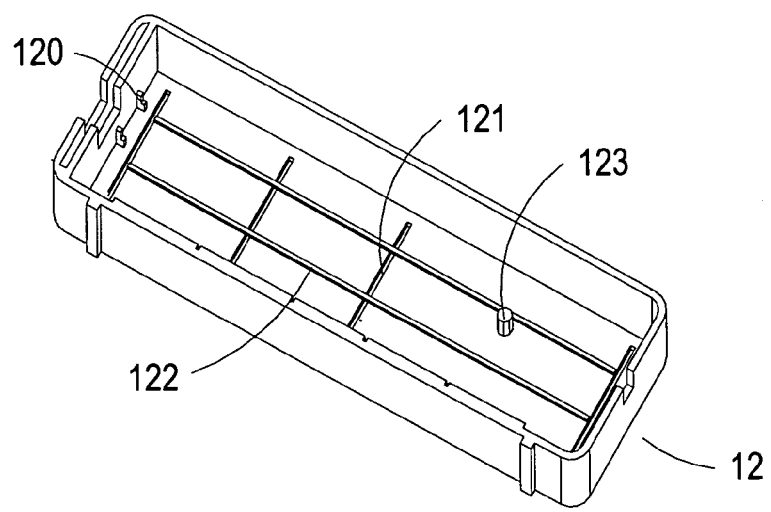
FIG. 2(b) is a schematic perspective view illustrating a lower housing of the power adapter in FIG. 2(a)
Figure 2C:
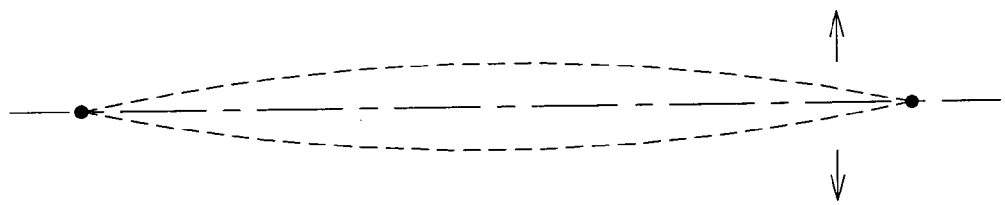
FIG. 2(c) is a schematic amplitude distribution diagram of the printed circuit board of the power adapter in FIG. 2(a)

Referring to FIGS. 2(a) and 2(b), a power adapter 2 according to a preferred embodiment of the present invention includes an upper housing 11 and a lower housing 12. A space is defined between the upper housing 11 and the lower housing 12 for accommodating a printed circuit board 13 therein. An AC inlet 14, a DC power cord connector 15, a heavier component 16 and a lighter component 17 are mounted on the printed circuit board 13. Several protrusion pieces 120 are integrally formed on opposite sides of the inner surface of the lower housing 12. Several vertical ribs 121 and horizontal ribs 122 are integrally formed on the inner surface of the lower housing 12. The vibration reducing structure of this embodiment further comprises a first post 123 integrally formed on the inner surface of the lower housing 12 and arranged under the heavier component 16, and a second post 111 integrally formed on the inner surface of the upper housing 11 and arranged above the heavier component 16 corresponding to the first post 123. With such arrangement, the gap g2 between the printed circuit board 13 and the first post 123 (or the lower housing 12) and the gap g3 between the heavier component 16 and the second post 111 (or the upper housing 11) are both decreased when compared with the gap g1, thereby effectively limiting the vibration amplitude, as can be seen in FIG. 2(c).

Figure 3A:
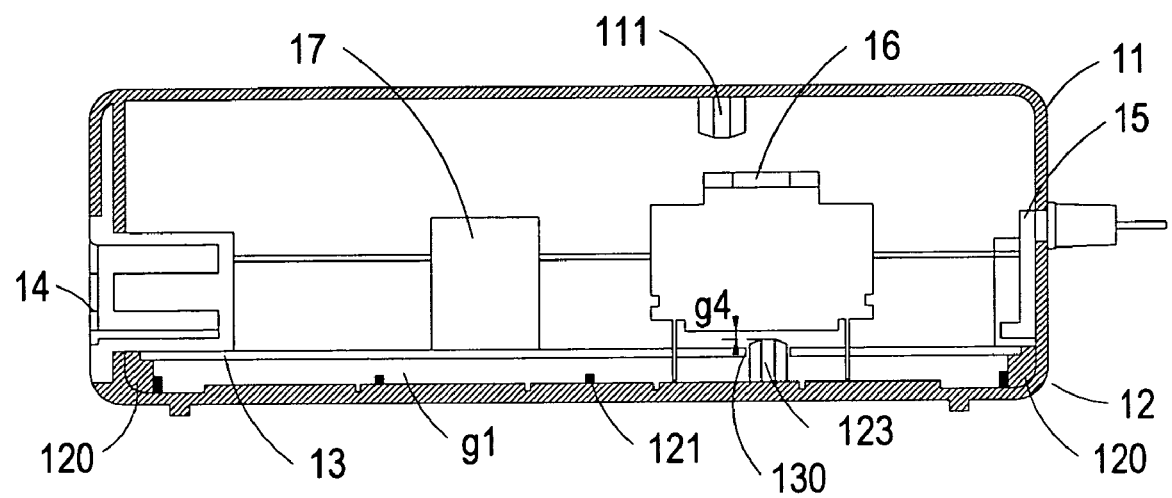
FIG. 3(a) is a schematic side view of a power adapter according to another preferred embodiment of the present invention.
Figure 3B:
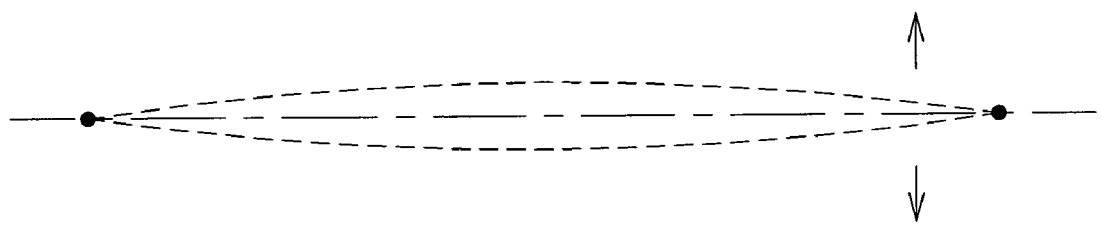
FIG. 3(b) is a schematic amplitude distribution diagram of the printed circuit board of the power adapter in FIG. 3(a).

A further embodiment of a power adapter is illustrated in FIG. 3(a). The power adapter 3 of this embodiment is identical to that of FIG. 2(a), except that the first post 123 penetrates through an opening 130 in the printed circuit board 13. A gap g4 is formed between the bottom of the heavier component 16 and the top of the first post 123. With such arrangement, the gap g4 between the bottom of the heavier component 16 and the top of the first post 123 is decreased when compared with the gap g1, thereby effectively limiting the vibration amplitude, as can be seen in FIG. 3(b).

From the above description, the vibration reducing structure of the present invention is capable of minimizing the vibration impact on the printed circuit board of the electronic device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A vibration reducing structure of an electronic device, comprising:
   first and second housings defining a space therebetween; a printed circuit board disposed within said space and having a heavy component mounted on a first surface thereof; a first post arranged on said first housing and under said heavy component; and a second post arranged on said second housing and above said heavy component; wherein said printed circuit board further comprises an opening corresponding to said first post; and wherein said first post penetrates through said opening and a gap is formed between the bottom of said heavy component and said first post.

2. The vibration reducing structure according to claim 1 wherein said first post is integrally formed with said first housing.

3. The vibration reducing structure according to claim 1 wherein a gap is formed between said printed circuit board and said first post.

4. The vibration reducing structure according to claim 1 wherein said second post is integrally formed with said second housing.

5. The vibration reducing structure according to claim 1 wherein said second post is corresponding to said first post.

6. The vibration reducing structure according to claim 1 wherein said heavy component is an electronic component selected from a group consisting of a transformer, an inductor, a choke and a wound toroid.

7. The vibration reducing structure according to claim 1 wherein said first and second housings are lower and upper housing of said electronic device, respectively.

8. The vibration reducing structure according to claim 7 further comprising a plurality of protrusion pieces integrally formed on opposite sides of said inner surface of said lower housing for supporting the periphery of said printed circuit board.

9. The vibration reducing structure according to claim 1 wherein said electronic device is selected from a group consisting of a power adapter, a charger and a power supply device.

10. The vibration reducing structure according to claim 1 further comprising a plurality of ribs arranged on said first housing.

11. The vibration reducing structure according to claim 1 wherein said ribs are integrally formed with said first housing.

12. The vibration reducing structure according to claim 1 wherein said ribs comprise at least one first rib extended in a first direction and at least one second rib extended in a second direction.

13. The vibration reducing structure according to claim 12 wherein said first direction is perpendicular to said second direction.

* * * * *